United States Patent

Bass

[11] Patent Number: 6,053,163
[45] Date of Patent: Apr. 25, 2000

[54] STOVE PIPE THERMOELECTRIC GENERATOR

[75] Inventor: John C. Bass, La Jolla, Calif.

[73] Assignee: Hi-Z Technology, Inc., San Diego, Calif.

[21] Appl. No.: 09/366,949

[22] Filed: Aug. 4, 1999

[51] Int. Cl.⁷ ........................................................ F23L 3/00
[52] U.S. Cl. ........................ 126/312; 126/290; 126/80; 126/307 R; 310/306
[58] Field of Search ................................ 126/110 B, 110 E, 126/110 R, 312, 80, 307 R, 285 R, 289, 290; 236/93 R, 101 B; 165/901; 292/2; 310/306

[56] References Cited

U.S. PATENT DOCUMENTS

| | | | |
|---|---|---|---|
| 3,759,244 | 9/1973 | Konet | 126/110 B |
| 4,843,273 | 6/1989 | Dammers et al. | 126/110 B |
| 4,942,863 | 7/1990 | Chou et al. | 126/110 BG |
| 5,033,956 | 7/1991 | Nystrom | 126/93 |
| 5,495,829 | 3/1996 | Jayaraman et al. | 126/110 R |
| 5,793,119 | 8/1998 | Zinke | 126/110 E |
| 5,892,656 | 4/1999 | Bass | 361/699 |

*Primary Examiner*—James C. Yeung
*Attorney, Agent, or Firm*—John R. Ross; John R. Ross, III

[57] ABSTRACT

A stovepipe thermoelectric generator. The unit fits in a stovepipe of a coal or wood stove. At least one thermoelectric module is sandwiched between a hot side fin unit with fins extending into the flow of exhaust gases and a cold side fin unit with fins cooled by forced room air. A damper controls exhaust gas flow through a heat chamber, directing the exhaust gas through a generating side and a bypass side depending on a temperature indication. This prevents heat damage to the thermoelectric module. At least one fan is provided to force room air through cooling fins of the cold side fin unit An electric circuit is described for providing power for the fan and providing additional electric power for purposes such as charging a battery.

10 Claims, 7 Drawing Sheets

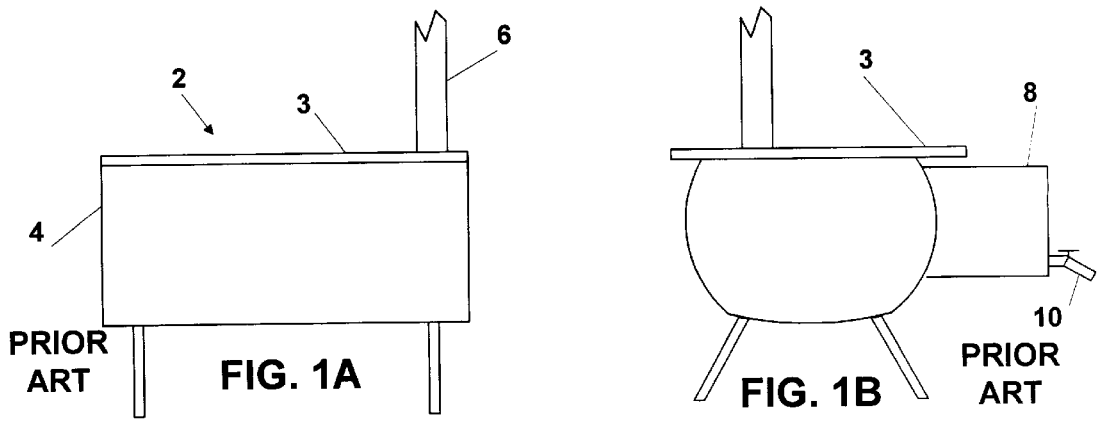
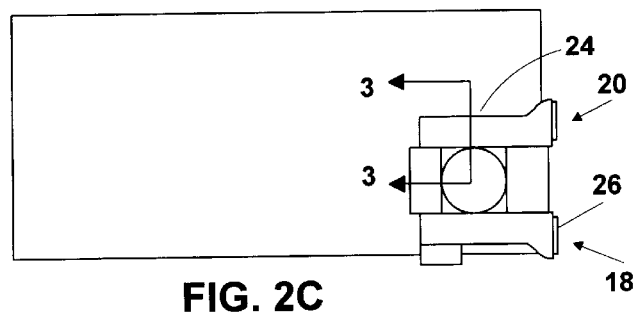
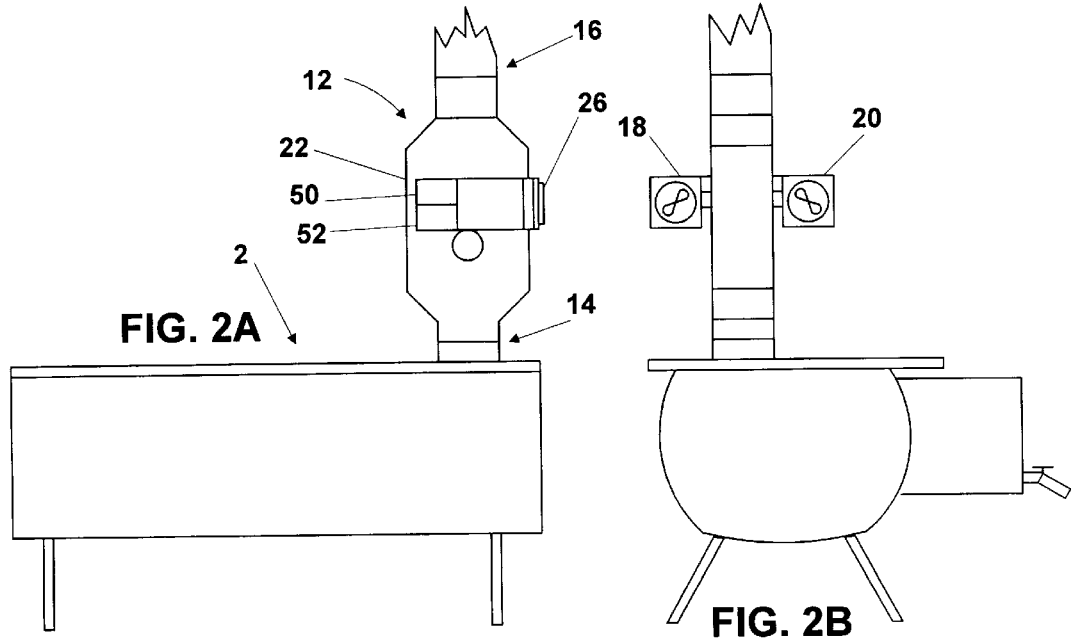

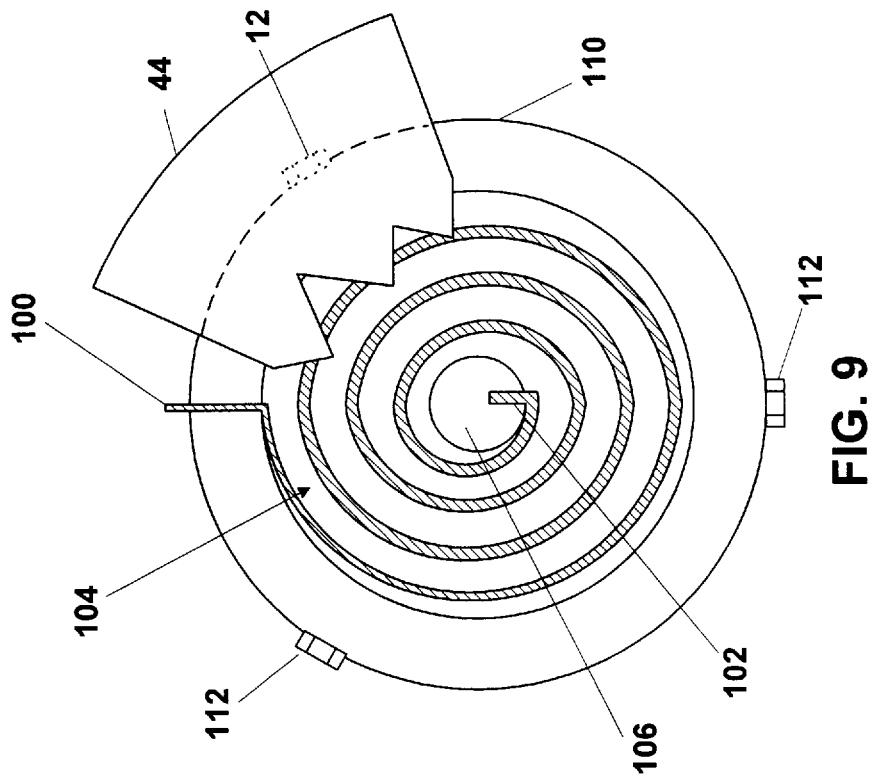
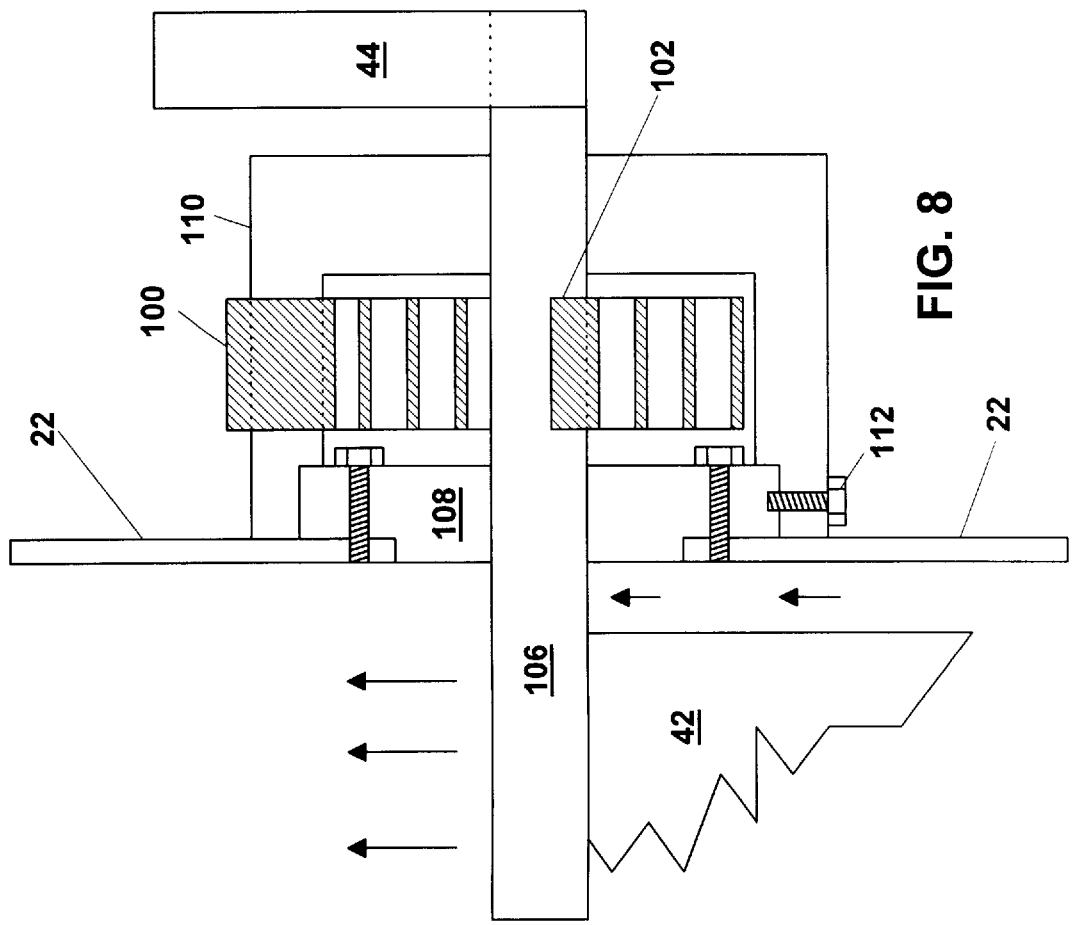

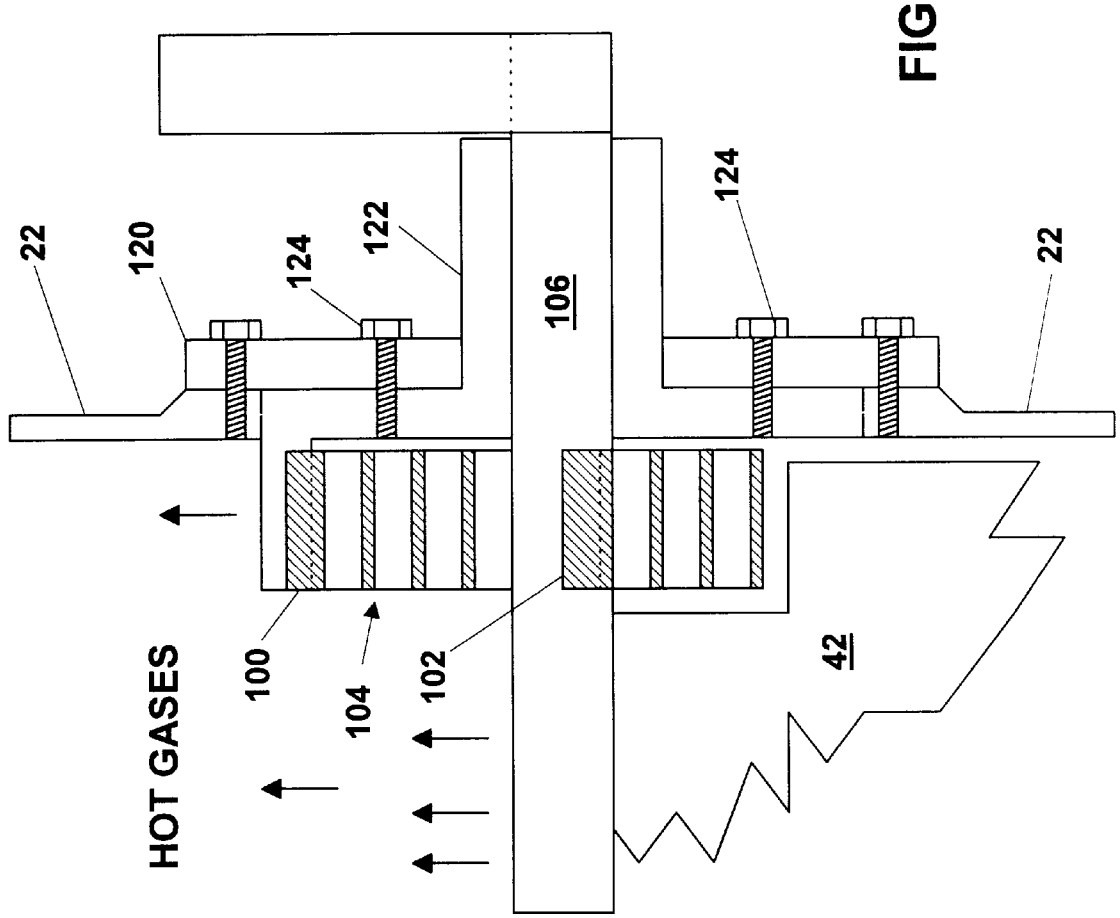

STOVE PIPE THERMOELECTRIC GENERATOR

BACKGROUND OF THE INVENTION

Wood and coal stoves have been used very extensively for more than 100 years for space heating and cooking. These stoves continue to be used in the United States especially in remote locations. In many third world countries these types of stoves are very common. A typical wood or coal stove 2 is shown in FIGS. 1A and 1B. This particular stove is portable in that a mule can easily transport it. Its principal components are combustion chamber 4, cooking top 3, and smoke pipe 6. This unit also comprises a removable hot water tank 8 with spigot 10.

Oil and gas stoves normally operate at a fixed BTU rating and temperature is controlled by a thermostat, which turns the stove on, and off. A particular feature of coal and wood stoves which distinguishes them from typical oil or gas stoves and furnaces is that the heat produced can be extremely variable. The stove pipe of a typical wood or coal stove can get so hot from the exhaust gases that it glows red.

Thermoelectric devices are well known and have been commercially available for about 30 years. One such module is described in U.S. Pat. No. 5,892,656 that is incorporated herein by reference. Its dimensions are 2½ inches×2½ inches×¼ inch and with a temperature difference of 360 degrees F will produce 14 Watts at 1¾ volts.

At many locations both in the United States and other countries where heating and cooking are done with wood or coal stoves, there is no convenient source of electricity.

What is need is a device for using stove pipe heat of a wood or coal stove for generation of electricity.

SUMMARY OF THE INVENTION

The present invention provides a stovepipe thermoelectric generator. The unit fits in a stovepipe of a coal or wood stove. At least one thermoelectric module is sandwiched between a hot side fin unit with fins extending into the flow of exhaust gases and a cold side fin unit with fins cooled by forced room air. A damper controls exhaust gas flow through a heat chamber, directing the exhaust gas through a generating side and a bypass side depending on a temperature indication. This prevents heat damage to the thermoelectric module. At least one fan is provided to force room air through cooling fins of the cold side fin unit. An electric circuit is described for providing power for the fan and providing additional electric power for purposes such as charging a battery.

BRIEF DESCRIPTION OF THE DRAWINGS

FIGS. 1A and B show a prior art wood stove.

FIGS. 2A, B and C are three views of a preferred embodiment of the present invention.

FIGS. 8 and 9 show details of an embodiment utilizing the automatic temperature dependent exhaust gas flow control.

FIG. 10 shows details of another embodiment utilizing the automatic temperature dependent exhaust gas flow control.

DETAILED DESCRIPTION OF PREFERRED EMBODIMENTS

First Preferred Embodiment

General Arrangement

Figure 3:
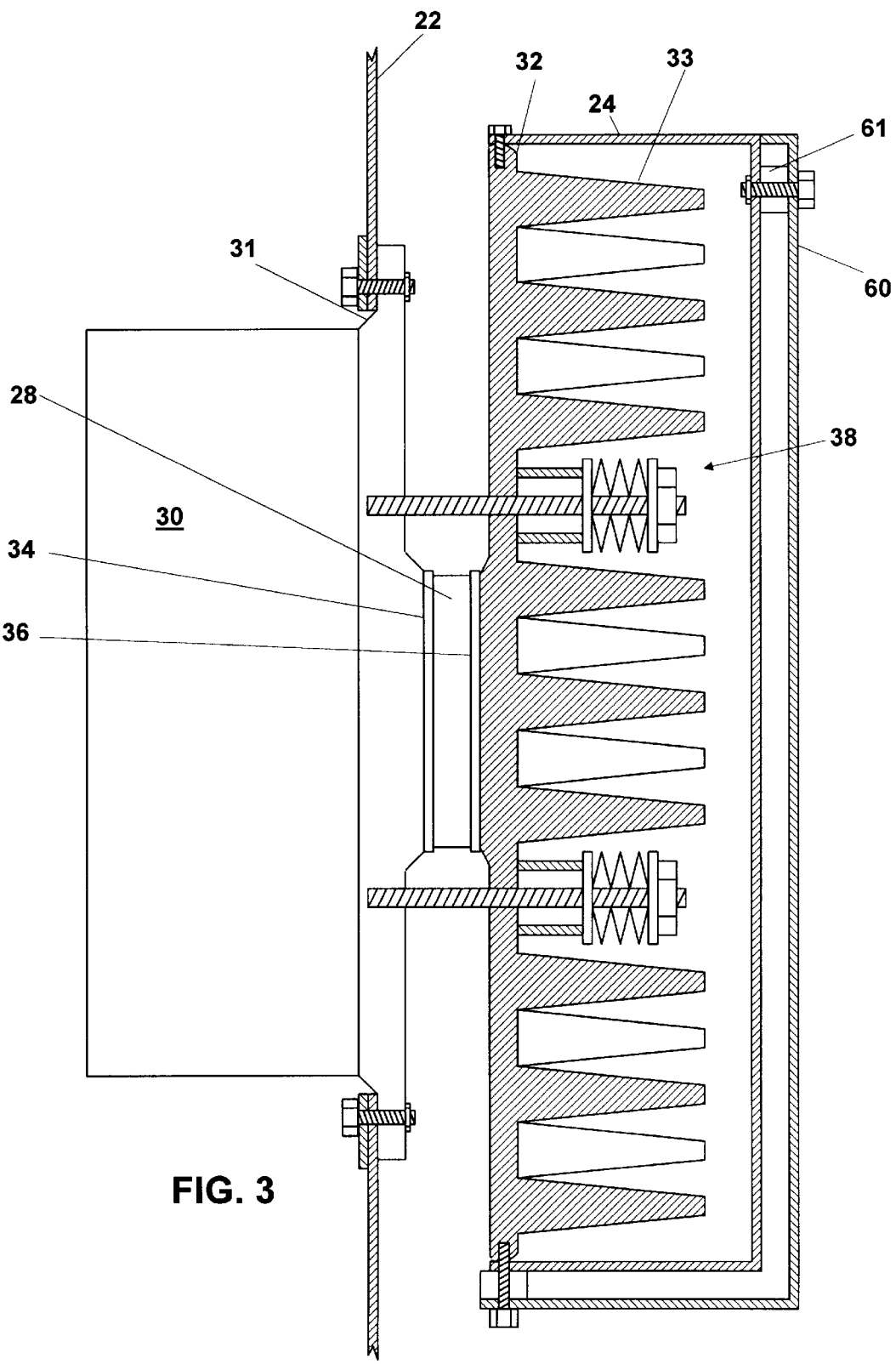
FIG. 3 is a cross section view showing a thermoelectric module installed in a stove pipe thermoelectric generator and sandwiched between hot gas fins and room air fins.

FIGS. 2A, B and C show, respectively, the side, back and top view of a preferred embodiment of the present invention. Stove 2 is a portable wood stove distributed by Blue Star Co. with offices in Missoula, Mont. It is light weight and is mule portable. In this embodiment stovepipe thermoelectric generator unit 12 has replaced the first stovepipe section. It is the same length as a standard stovepipe section (i.e., 2½ feet). The bottom of the unit has a 5-inch diameter and is crimped to fit into the stovepipe hole at the top of the stove 2 as shown at 14. The top of the unit also in nominally 5 inches and is not crimped so that a crimped stovepipe section can be inserted at the top as shown at 16. Generator unit 12 comprises thermoelectric generating systems 18 and 20, a heat chamber 22 with temperature dependent exhaust gas flow control, a DC to DC converter 50 and a 12 volt battery 52.

Thermoelectric Generating Systems

Figure 4:
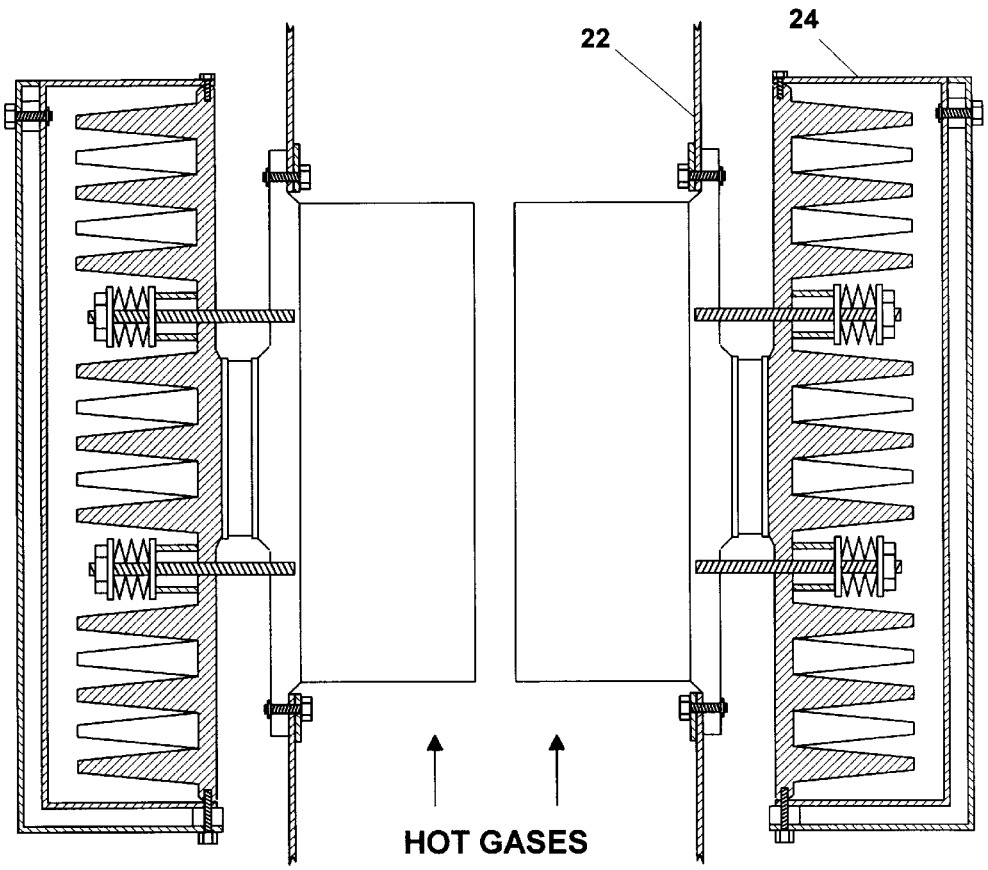
FIG. 4 shows how two units fit in the stovepipe generator.

Each of the two thermoelectric generating systems comprises a room air duct 24 through which flows room air forced by 12 volt, 1 Watt fan 26. Each duct has a 6-inch square inlet on which the fan is mounted. Preferably, the intake of fan 26 is located behind the stove where it is assessable to the cooler air that is located behind the stove. The horizontal dimension of the duct decreases to only 3 inches for most of the length of the duct as shown in FIG. 2C. FIG. 3 shows a cross section through duct 24. This drawing shows thermoelectric module 28 sandwiched between hot gas plate fin unit 31, with 11 plate fins 30 and room air finger fin unit 32 with 231 finger fins 33. The module is electrically isolated from the two fins by 1 mill Kapton® films 34 and 36. Kapton® is a trademark of Dupont Corp. and is used to describe a well-known polyimide material. Good thermal contact is provided by four Belville spring stacks 38 each of which includes four Belville springs in series, two washers, a stud screwed into fin unit 31, a hollow cylindrical spacer and a nut. At room temperature recommended torque to be applied to the nut is 3 inch-pounds. Aluminum heat shield 60 is attached to the bottom and side of air duct 24 to minimize the heat transfer from heat rising up from the stove. Spacers 61 separate heat shield 60 from air duct 24 by approximately 0.2 inch. In this embodiment a ⅛-inch thick sheet of alumina insulation is attached to fin unit 31. FIG. 4 shows the FIG. 3 cross section extended to show the opposite side of unit 12.

Thermoelectric Module

Thermoelectric module 28 is preferably the module described in the Background section. Such Modules are available from HiZ Corporation with offices in San Diego, Calif. although other thermoelectric modules could be utilized.

Automatic Temperature Dependent Exhaust Gas Flow Control

Figure 5:
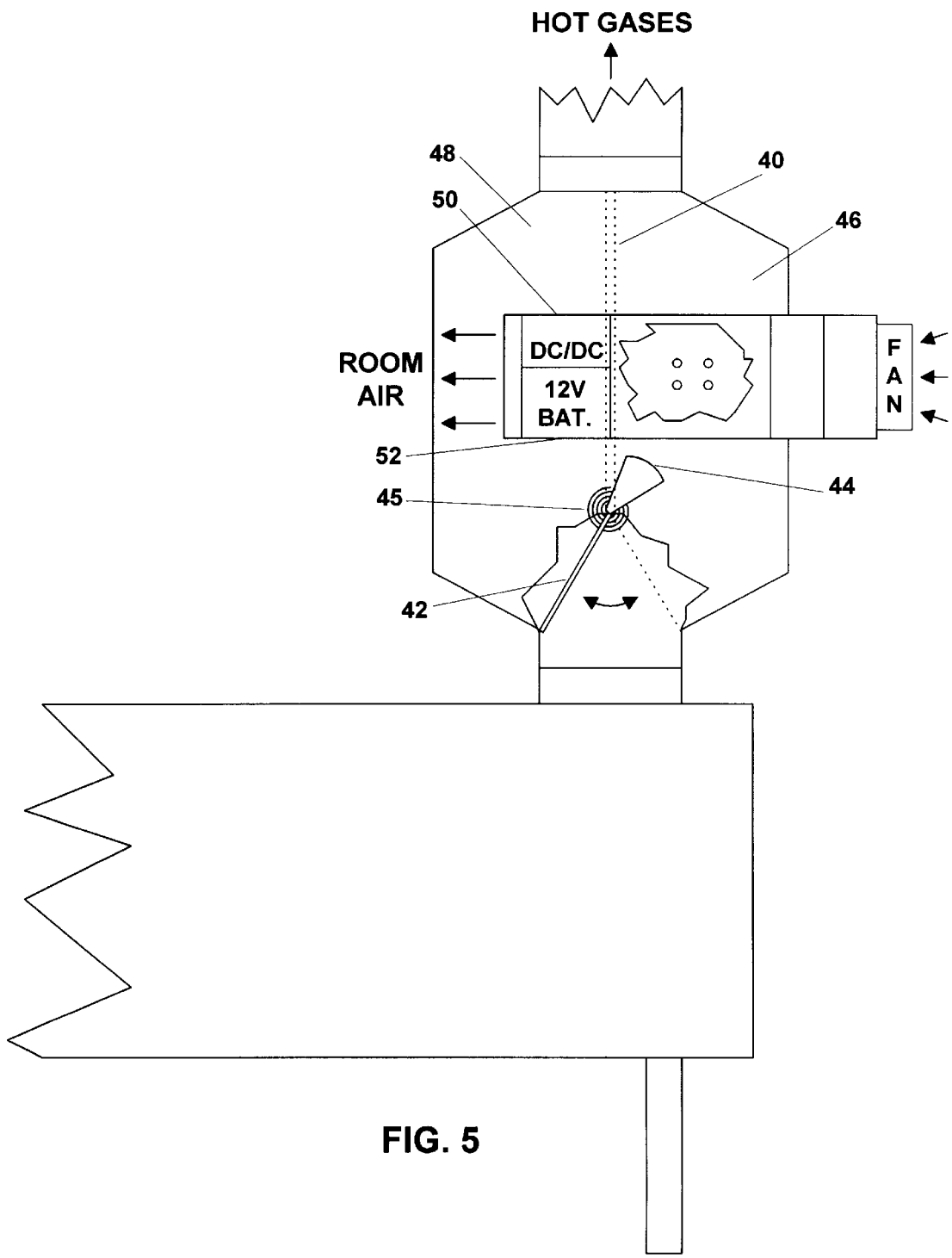
FIG. 5 is a side view of the preferred embodiment showing hot gas and airflow patterns and an automatic vane control to prevent over heating of the module.

This embodiment comprises an automatic temperature dependent exhaust gas flow control system. As shown in FIG. 5, the heat chamber 22 of stove pipe generator unit 12 is divided into two parts, generating side 46 and bypass side 48, by separator vane element 40. Flow through heat chamber 22 is regulated by damper 42, the position of which is determined by two bimetallic spiral units 45 mounted as shown on both sides of the outside surface of heat chamber 22. The bimetallic spiral units are available from suppliers such as Atlantic Alloys Inc. with offices in Bristol, R.I. Spiral units 45 are adjusted as shown in FIG. 5 to direct substantially all exhaust gas flow through generating side 46 when the temperature of the surface of chamber 22 is less than about 250 degrees F. At temperatures above approximately 250 degrees F, units 45 will swing damper 42 toward the right (looking at FIG. 5). At temperatures above approximately 500 degrees F flow to generating side 46 would be almost completely closed off and the exhaust gasses would be sent up bypass side 48. This prevents destruction of the modules which could otherwise occur if subjected to a hot side fin temperature much in excess of about 500 degrees F.

Figure 7:
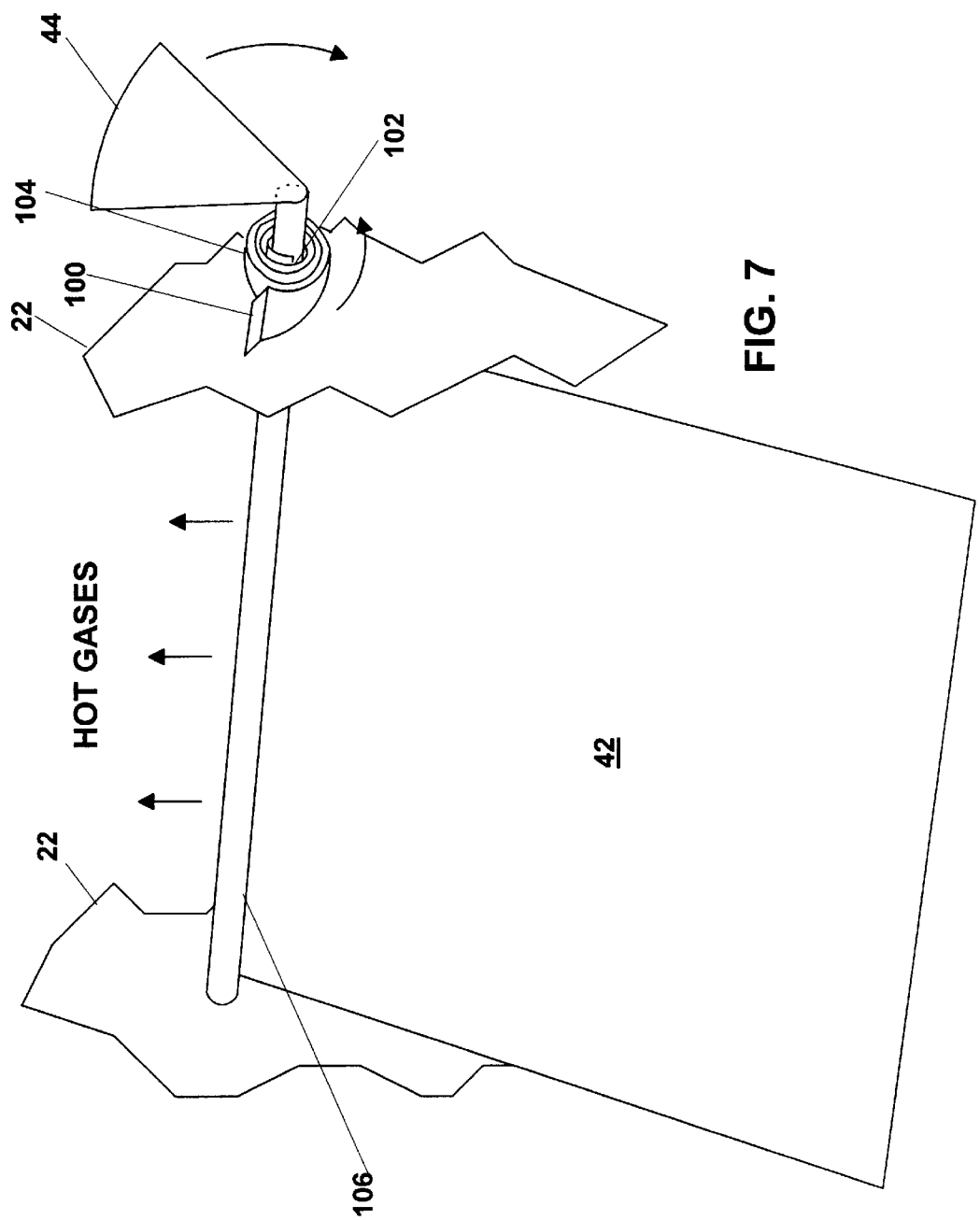
FIG. 7 shows a simplified drawing of the automatic temperature dependent exhaust gas flow control.

FIG. 7 shows a simplified drawing of the automatic temperature dependent exhaust gas flow control. Each bimetallic spiral unit 45 contains a bimetallic spiral spring 104. Spring end 100 is affixed so that it is stationary with respect to heat chamber 22. Spring end 102 is inserted into a slot in pivot axis 106. Damper 42 is rigidly attached to pivot axis 106 inside of heat chamber 22. Counter weight 44 functions to counter the weight of damper 42 and to rotate pivot axis 106 clockwise, looking at FIG. 5.

As hot exhaust gases enter heat chamber 22, heat is transferred to bi-metallic spiral spring 104. The heat causes bimetallic spiral spring 104 to expand. The expansion of bimetallic spiral spring 104 tends to rotate pivot axis 106 counter clockwise. Likewise, as the temperature of the gas in chamber 46 is reduced, bi-metallic spiral spring 104 will cool and contract, which will cause pivot axis 106 to rotate clockwise. In this manner, damper 42 automatically rotates from side to side as depicted in FIG. 5 to regulate the temperature in chamber 46.

A more detailed explanation of the automatic temperature dependent exhaust gas flow control is given by reference to FIGS. 8 and 9. Pivot axis 106 is inserted through the center of aluminum base 108 and is free to rotate on aluminum base 108. Aluminum base 108 is bolted to the walls of heat chamber 22. Adjustable cover 110 is attached with set screws 112 to aluminum base 108. Spring end 102 of bi-metallic spiral spring 104 is rigidly inserted into a slot in pivot axis 106 and spring end 100 is rigidly inserted into a slot in adjustable 110. Counter weigh 44 is rigidly attached to the end of pivot axis 106.

Hot gases inside of heat chamber 22 increase the temperature of aluminum base 108, which rapidly transfers heat to bimetallic spiral spring 104. As bimetallic spring 104 is heated, it expands and unwinds, causing pivot axis 106 to rotate in a counter clockwise direction as described above.

Adjustable cover 110 keeps bimetallic spiral spring 104 from cooling rapidly as a result of the ambient room temperature. Adjustable cover 110 is also used to preload the bimetallic spiral spring so that it requires a rather large temperature (250° F.) before the damper vane starts to move. Adjustable cover 110 is held in place by three set screws 112 which pass through partial circumferential slots in adjustable cover 110 and thread into aluminum base 108. When set screws 112 are loose, adjustable cover 110 and bimetallic spiral spring 104 can be rotated. The tighter bimetallic spiral spring 104 is wound, the greater the degree of preload. When set screws 112 are tightened, adjustable cover 104 and outer spring tab 100 are held firmly in place against rotation.

FIG. 10 shows an alternate preferred embodiment in which bi-metallic spiral spring 104 is located inside heat chamber 22. By locating bimetallic spiral spring 104 inside heat chamber 22, a more rapid response to exhaust gas temperature is achieved. Stationary plate 120 is bolted to the walls of heat chamber 22. Rotation plate 122 is bolted to stationary plate 120 with bolts 124. When bolts 124 are sufficiently loosened, rotation plate 122 is free to rotate around pivot axis 106. By rotating rotation plate 122, bimetallic spiral spring 104 can be preloaded. Spring end 100 is rigidly inserted into a slot in rotation plate 122. Spring end 102 is rigidly inserted into a slot in pivot axis 106. In a preferred embodiment, stationary plate 120 and rotation plate 122 are both made from steel.

Hot gases inside heat chamber 22 increase the temperature of bimetallic spiral spring 104, causing it to expand, unwind and rotate pivot axis 106. As bi-metallic spiral spring 104 is cooled, it contracts and rewinds, causing pivot axis 106 to rotate in the opposite direction.

Electric Circuit

Figure 6:
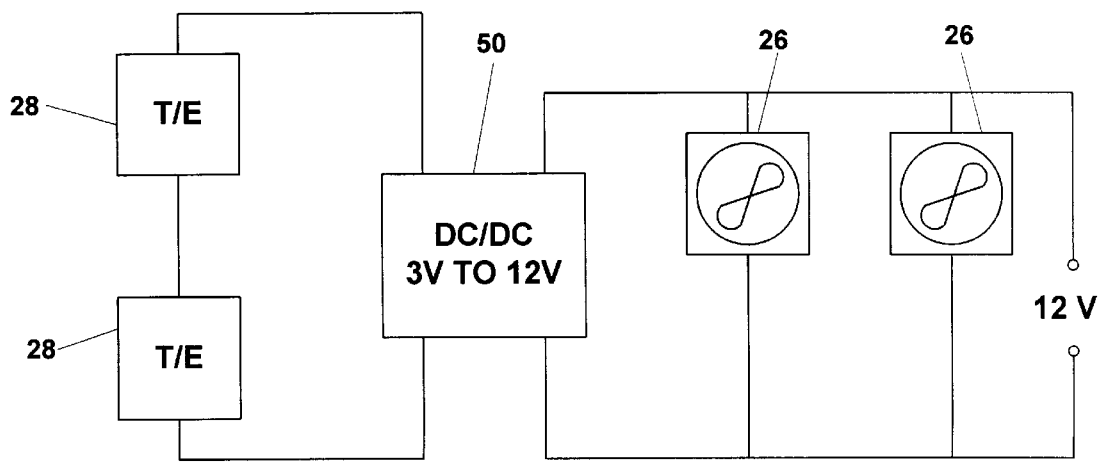
FIG. 6 shows the electric circuit of the preferred embodiment.

The electric circuit in this embodiment is simple as shown in FIG. 6. The two modules 28 are connected in series to produce together about 3.5 volts at matched load. The output of the two modules is converted to 12 volts by DC/DC converter 50 which powers fans 26 and charges battery 52. In this embodiment converter 50 is Model No. PT6673 supplied by Power Trends, Inc. with offices in Warrenville, Ill.

While the above description has dealt with a single preferred embodiment of the present invention, the reader should understand that many modifications could be made and still be within the scope of the invention. For example, the diameter of the inlet of the unit at 14 (FIG. 2A) and the outlet at 16 can be varied to match other stove outlet and pipe diameters. Also, control of the damper could be provided with a temperature sensor, a processor and a small motor. The position of the damper could be regulated with a feedback setup. Other fin devices could be used. More than two generating units could be utilized. For example, if 8 units were used, 12 volts could be provided and the DC to DC converter could be eliminated. If less power is required one generating unit might be sufficient. A different converter would be needed or the maybe a 6 Volt system could be utilized. Therefore, the attached claims and their legal equivalents should determine the scope of the invention.

I claim:

1. A stovepipe thermoelectric generator, comprising:
  A) a variable heat producing stove comprising:
    1) a combustion chamber, and
    2) a stovepipe defining a bottom end and a top end, wherein said stovepipe is connected to said combustion chamber at said bottom end, wherein exhaust gases produced in said combustion chamber exit said variable heat producing stove through said stovepipe,
  B) a heat chamber defining a generating side and a bypass side, wherein said heat chamber is connected to said top end of said stovepipe,
  C) a thermoelectric generator incorporated in said generating side for generating electric power, said thermoelectric generator comprising:
    1) a hot side fin unit defining fins extending into the flow of the exhaust gases,
    2) a cold side fin unit defining fins cooled by room air, and 3) at least one thermoelectric module defining a cold surface and a hot surface sandwiched between said at least one hot side fin unit and said at least one cold side fin unit, D) a damper defining a pivot axis pivotally attached between said generating side and said bypass side, wherein said damper directs exhaust gases through said generating side or said bypass side depending on a temperature indication, and E) at least one fan, wherein said fan forces room air through said fins of said cold side fin unit.

2. A stovepipe thermoelectric generator as in claim 1, wherein said at least one thermoelectric module comprises:

A) a crate having the form of an eggcrate defining a plurality of thermoelectric element spaces, B) a plurality of p-type thermoelectric elements, C) a plurality of n-type thermoelectric elements, said p-type and said n-type thermoelectric elements being positioned in said thermoelectric element spaces, D) a metallized coating on said cold surface connecting p-type thermoelectric elements to n-type thermoelectric elements on said cold surface, E) a metallized coating on said hot surface connecting p-type thermoelectric elements to n-type thermoelectric elements on said hot surface, wherein the position of said p-type and said n-type elements, the configuration of said crate having the form of an eggcrate and said metallized coatings being effective to cause a plurality of said thermoelectric elements to be electrically connected in series.

3. A stovepipe thermoelectric generator as in claim 1, further comprising an electric circuit, wherein said electric circuit provides electric power for said at least one fan.

4. A stovepipe thermoelectric generator as in claim 1, further comprising an electric circuit, wherein said electric circuit provides electric power to an external load.

5. A stovepipe thermoelectric generator as in claim 4, wherein said external load comprises a rechargeable battery.

6. A stovepipe thermoelectric generator as in claim 1, further comprising an automatic temperature dependent exhaust gas flow control means for controlling the pivotal position of said damper.

7. A stovepipe thermoelectric generator as in claim 1, further comprising an automatic temperature dependent exhaust gas flow control connected to said damper.

8. A stovepipe thermoelectric generator as in claim 7, wherein said automatic temperature dependent exhaust gas flow control comprises a bimetallic spiral spring rigidly attached at a first end so that it is stationary with respect to said heat chamber and rigidly attached at a second end to said pivot axis, wherein exhaust gas heat is transferred to said bimetallic spiral spring, wherein said bimetallic spiral spring expands as said bimetallic spiral spring temperature increases and contracts as said bimetallic spiral spring temperature decreases, wherein the expansion and contraction of said bimetallic spiral spring causes said damper to pivot around said pivot axis.

9. A stovepipe thermoelectric generator as in claim 7, wherein said automatic temperature dependent exhaust gas flow control comprises:

A) an aluminum base rigidly connected to said heat chamber, wherein said pivot axis is rotatably supported by said aluminum base, B) an adjustable cover adjustably connected to said aluminum base, and C) a bimetallic spiral spring rigidly connected to said pivot axis and rigidly connected to said adjustable cover, wherein said bimetallic spiral spring is between said aluminum base and said adjustable cover, wherein exhaust gas heat is transferred from the exhaust gas to said bimetallic spiral spring through said aluminum base, wherein said bi-metallic spiral spring expands as said bimetallic spiral spring temperature increases and contracts as said bimetallic spiral spring temperature decreases, wherein the expansion and contraction of said bi-metallic spiral spring causes said damper to pivot around said pivot axis.

10. A stovepipe thermoelectric generator as in claim 7, wherein said automatic temperature dependent exhaust gas flow control comprises:

A) a stationary plate rigidly connected to said heat chamber,

B) a rotation plate adjustably connected to said stationary plate, wherein said pivot axis is rotatably supported by said rotation plate, C) a bimetallic spiral spring rigidly connected to said pivot axis and rigidly connected to said rotation plate, wherein said bi-metallic spiral spring is inside said heat chamber, wherein exhaust gas heat is transferred from the exhaust gas to said bimetallic spiral spring by direct contact, wherein said bi-metallic spiral spring expands as said bimetallic spiral spring temperature increases and contracts as said bimetallic spiral spring temperature decreases, wherein the expansion and contraction of said bi-metallic spiral spring causes said damper to pivot around said pivot axis.

* * * * *